United States Patent
Nishimori et al.

(10) Patent No.: US 10,270,406 B2
(45) Date of Patent: Apr. 23, 2019

(54) POWER AMPLIFIER, SEMICONDUCTOR INTEGRATED CIRCUIT, AND METHOD OF CONTROLLING THE POWER AMPLIFIER

(71) Applicant: FUJITSU LIMITED, Kawasaki-shi, Kanagawa (JP)

(72) Inventors: Masato Nishimori, Atsugi (JP); Tatsuya Hirose, Yokohama (JP); Ikuo Soga, Isehara (JP); Masayuki Hosoda, Yamato (JP); Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/648,046

(22) Filed: Jul. 12, 2017

(65) Prior Publication Data
US 2018/0041177 A1 Feb. 8, 2018

(30) Foreign Application Priority Data

Aug. 4, 2016 (JP) .................. 2016-153953

(51) Int. Cl.

| | | |
|---|---|---|
| H03F 1/07 | (2006.01) |
| H03F 3/195 | (2006.01) |
| H03F 1/30 | (2006.01) |
| H03G 3/30 | (2006.01) |
| H01L 23/66 | (2006.01) |
| H03F 1/02 | (2006.01) |

(52) U.S. Cl.
CPC ............ *H03F 3/195* (2013.01); *H01L 23/66* (2013.01); *H03F 1/0288* (2013.01); *H03F 1/30* (2013.01); *H03F 1/301* (2013.01); *H03G 3/3042* (2013.01); *H03F 2200/447* (2013.01); *H03F 2200/451* (2013.01); *H03F 2200/481* (2013.01)

(58) Field of Classification Search
CPC .................................. H03F 1/07; H03F 1/0288
USPC ............................................. 330/295, 124 R
See application file for complete search history.

(56) References Cited

U.S. PATENT DOCUMENTS

| 4,631,493 A * | 12/1986 | Vendelin ............... H03F 1/0283 330/277 |
| 4,853,649 A * | 8/1989 | Seino .................. H01L 27/0605 257/E27.012 |
| 5,757,229 A | 5/1998 | Mitzlaff |
| 6,617,929 B2 * | 9/2003 | Kim ...................... H03F 1/0288 330/124 R |
| 2002/0130720 A1 * | 9/2002 | Pavio ...................... H03F 3/607 330/286 |
| 2003/0231061 A1 * | 12/2003 | Lautzenhiser .......... H03F 1/301 330/295 |

FOREIGN PATENT DOCUMENTS

| JP | 4210332 | 1/2009 |
| WO | 2008-012883 | 1/2008 |

* cited by examiner

*Primary Examiner* — Henry Choe
(74) *Attorney, Agent, or Firm* — Fujitsu Patent Center

(57) ABSTRACT

A power amplifier includes a main amplifier, an auxiliary amplifier, and a control circuit. The main amplifier is configured to amplify input power, and the auxiliary amplifier is configured to amplify the input power when the input power exceeds a certain level. The control circuit, which is provided between a source of the main amplifier and a ground, is configured to control a source potential of the main amplifier so as to increase the source potential when the input power reaches at least a certain value.

5 Claims, 8 Drawing Sheets

POWER AMPLIFIER, SEMICONDUCTOR INTEGRATED CIRCUIT, AND METHOD OF CONTROLLING THE POWER AMPLIFIER

CROSS-REFERENCE TO RELATED APPLICATION

This application is based upon and claims the benefit of priority of the prior Japanese Patent Application No. 2016-153953, filed on Aug. 4, 2016, the entire contents of which are incorporated herein by reference.

FIELD

The present invention relates to a power amplifier, a semiconductor integrated circuit, and a method of controlling the power amplifier.

BACKGROUND

A recent increase in the amount of communication data in radio communications has grown demand for, for example, base stations with greater transmission power. As a wideband and high-efficiency microwave power amplifier, a Doherty-type power amplifier has received attention. The Doherty-type power amplifier includes a main amplifier (carrier amplifier) that amplifies an input signal and an auxiliary amplifier (peak amplifier) that amplifies an input signal when the input signal exceeds a certain level.

For example, for high-frequency, high-power amplifiers in base stations, Doherty-type power amplifiers (Doherty amplifiers) have been frequently used as final-stage power amplifiers. In other words, a Doherty amplifier can obtain high efficiency with a mobile communication system signal having a large difference between average power and peak power, and thus such a Doherty amplifier has been frequently used as, for example, a final-stage power amplifier in a base station.

The main amplifier operates as a class A or AB amplifier, whereas the auxiliary amplifier operates as a class B or C amplifier. For example, the main amplifier operates alone at low output power, whereas the auxiliary amplifier operates with the main amplifier at high output power.

However, when the auxiliary amplifier is turned on to start amplification at high power, the output phase of the auxiliary amplifier is considerably different from that of the main amplifier, leading to a large loss of power combination of the output power of the main amplifier and the output power of the auxiliary amplifier.

As described above, for example, as a high-efficiency high-power amplifier in a base station, a Doherty-type power amplifier has been used which includes a main amplifier that amplifies an input signal and an auxiliary amplifier that amplifies an input signal when the input signal exceeds a certain level.

However, when the auxiliary amplifier is turned on to start amplification at high output power, the output phases of the auxiliary amplifier and the main amplifier are considerably different from each other, causing a large loss of power combination of the output power of the main amplifier and the output power of the auxiliary amplifier.

To solve the problem, a technique is proposed to control the gate biases of a main amplifier and an auxiliary amplifier according to input power and reduce a loss of power combination of the output power of the main amplifier and the output power of the auxiliary amplifier. However, the control of the gate biases of the main amplifier and the auxiliary amplifier needs the provision of, for example, an orthogonal splitter, a detector, and a bias control circuit, resulting in a complicated and expensive circuit.

In the related art, various Doherty-type power amplifiers are proposed. For example, the gate biases of a main amplifier and an auxiliary amplifier are controlled according to input power in order to reduce a loss of power combination of the output power of the main amplifier and the output power of the auxiliary amplifier.

Patent Document 1: International Publication Pamphlet No. WO2008/012883

Patent Document 2: Japanese Patent No. 4210332

SUMMARY

According to an aspect of the embodiments, there is provided a power amplifier including a main amplifier, an auxiliary amplifier, and a control circuit. The main amplifier is configured to amplify input power, and the auxiliary amplifier is configured to amplify the input power when the input power exceeds a certain level.

The control circuit, which is provided between a source of the main amplifier and a ground, is configured to control a source potential of the main amplifier so as to increase the source potential when the input power reaches at least a certain value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
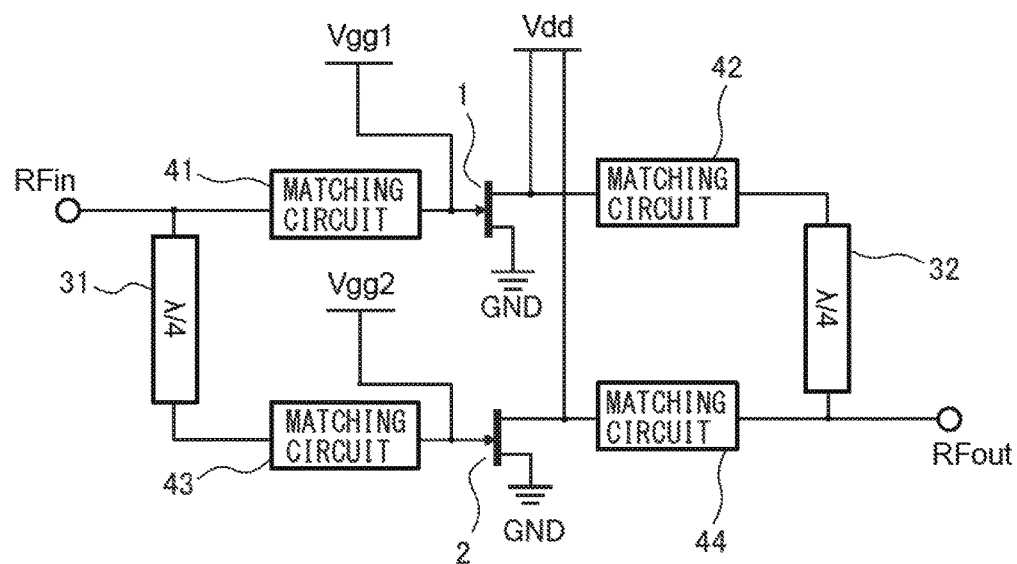
FIG. 1 is a block diagram illustrating an example of a power amplifier.
Figure 2:
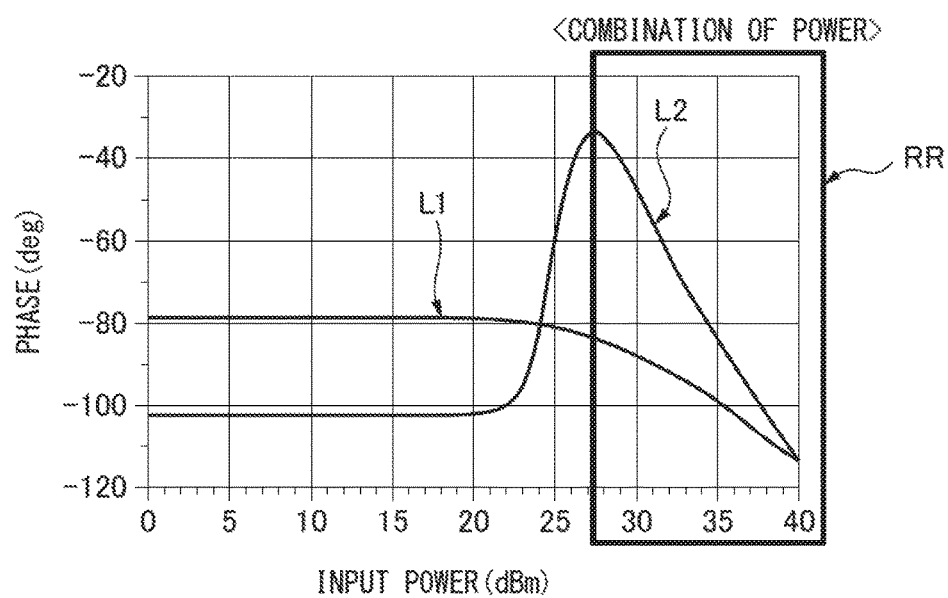
FIG. 2 is an explanatory drawing of the problems of the power amplifier illustrated in FIG. 1.

First, before describing embodiments of a power amplifier, a semiconductor integrated circuit, and a method of controlling the power amplifier, an example of a power amplifier and the problems thereof will be discussed with reference to FIG. 1 and FIG. 2. FIG. 1 is a block diagram illustrating an example of the power amplifier that is a schematically illustrated Doherty-type power amplifier (Doherty amplifier).

As illustrated in FIG. 1, the Doherty-type power amplifier includes a main amplifier (carrier amplifier) 1 that amplifies input power (input signal) RFin and an auxiliary amplifier (peak amplifier) 2 that amplifies input power when the input power exceeds a certain level. In FIG. 1, reference symbols 31 and 32 represent λ/4 transmission lines (¼ wavelength transmission lines) and reference symbols 41 to 44 represent matching circuits.

The main amplifier 1 includes a class A or AB transistor while the auxiliary amplifier 2 includes a class B or C transistor. For example, the input power RFin is inputted through the matching circuit 41 to the gate of the transistor (main amplifier) 1 that operates as a class AB amplifier, and the input power RFin is inputted through the λ/4 transmission line 31 and the matching circuit 43 to the gate of the transistor (auxiliary amplifier) 2 that operates as a class C transistor. Moreover, a class-AB bias voltage Vgg1 is applied to the gate of the transistor 1 while a class-C bias voltage Vgg2 is applied to the gate of the transistor 2.

The drain of the transistor 1 is connected to an output terminal (RFout) via the matching circuit 42 and the λ/4 transmission line 32 while the drain of the transistor 2 is connected to the output terminal via the matching circuit 44. A power supply voltage Vdd is applied to the drains of the transistors 1 and 2, and the sources of the transistors 1 and 2 are directly connected to the ground (GND). In other words, the output power (output signal) RFout is drawn from a common connected point of a node connected to the drain of the transistor 1 via the matching circuit 42 and the λ/4 transmission line 32 and a node connected to the drain of the transistor 2 via the matching circuit 44.

In the typical Doherty-type power amplifier, the main amplifier 1 is biased to the class AB (or class A) and the auxiliary amplifier 2 is biased to the class C (or class B). Thus, at low output power, the main amplifier 1 operates alone and obtains high efficiency, whereas at high output power, the main amplifier 1 operates with the auxiliary amplifier 2 and obtains a high-power operation.

However, the main amplifier 1 and the auxiliary amplifier 2 have different gate biases (bias voltages Vgg1 and Vgg2) and thus the transistors 1 and 2 vary in parasitic capacitance. FIG. 2 is an explanatory drawing of the problems of the power amplifier illustrated in FIG. 1. In FIG. 2, the characteristic curve L1 indicates the relationship between input power (dBm) and a phase (deg) at the output of the main amplifier 1 and a characteristic curve L2 indicates the relationship between input power and a phase at the output of the auxiliary amplifier 2.

As described above, the main amplifier 1 operates alone at low output power, whereas the main amplifier 1 operates with the auxiliary amplifier 2 at high output power, thereby combining the output power of the main amplifier 1 and the output power of the auxiliary amplifier 2. At this point, as illustrated in FIG. 2, the auxiliary amplifier 2 starts power amplification at high output power and a phase difference is large between the outputs of the main amplifier 1 and the auxiliary amplifier 2 particularly immediately after the start of the amplification of the auxiliary amplifier 2. In other words, in FIG. 2, in a rectangular region RR for power combination, a phase difference is large between the outputs of the main amplifier 1 and the auxiliary amplifier 2, leading to a large loss of power combination of the output power of the first amplifier and the output power of the second amplifier.

Figure 3:
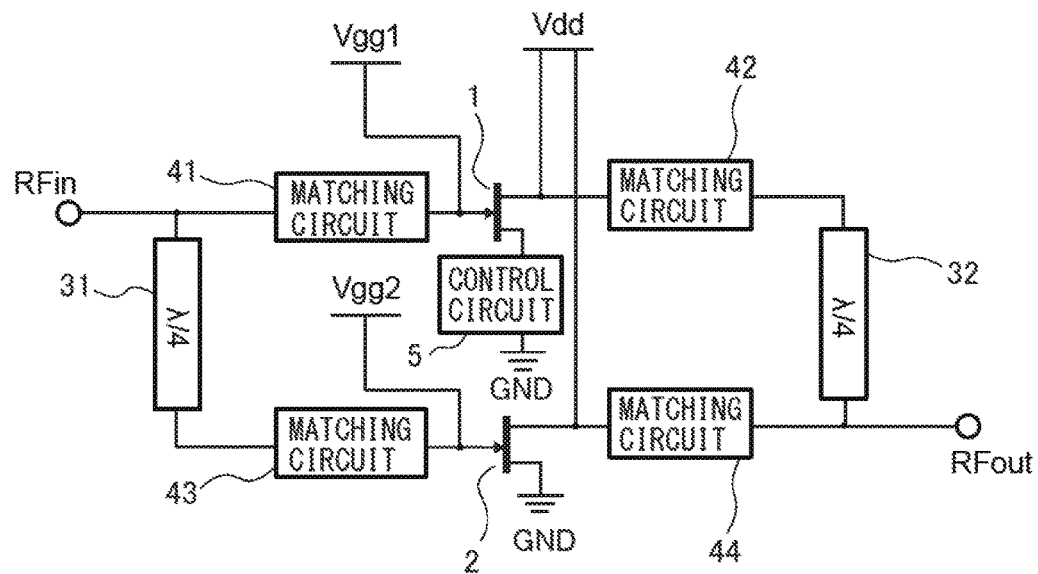
FIG. 3 is a block diagram illustrating the power amplifier of the present embodiment.

The embodiments of the power amplifier, the semiconductor integrated circuit, and the method of controlling the power amplifier will be specifically described below with reference to the accompanying drawings. FIG. 3 is a block diagram illustrating the power amplifier of the present embodiment, specifically, a Doherty-type power amplifier including a main amplifier (carrier amplifier) 1 and an auxiliary amplifier (peak amplifier) 2.

As is evident from a comparison between FIG. 3 and FIG. 1, the power amplifier of the present embodiment includes a control circuit 5 provided between the source of the main amplifier 1 and the ground (GND) unlike the power amplifier illustrated in FIG. 1. The control circuit 5 controls the source potential of the transistor (main amplifier) 1 so as to increase the source potential when, for example, the input power RFin reaches at least a certain value. This reduces a loss of power combination of the power of the transistor 1 and the power of the transistor (auxiliary amplifier) 2.

Figure 4:
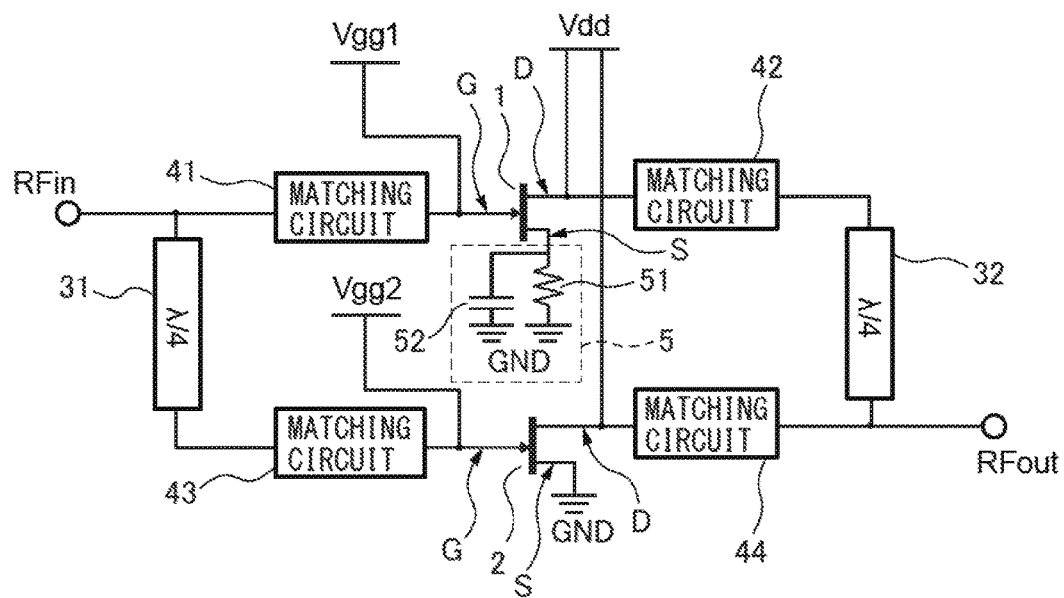
FIG. 4 is a block diagram illustrating a first example of the power amplifier.

FIG. 4 is a block diagram illustrating a first example of the power amplifier. As is evident from a comparison between FIG. 4 and FIG. 3, in the power amplifier of the first example, the control circuit 5 includes a resistance element 51 and a capacitative element 52 which are provided between a source S of the transistor (main amplifier) 1 and the ground GND.

For example, the input power RFin is inputted to a gate G of the class-AB transistor 1 through a matching circuit 41, and the input power RFin is inputted to a gate G of the class-C transistor (auxiliary amplifier) 2 through a λ/4 transmission line 31 and a matching circuit 43. A bias voltage (gate bias voltage) Vgg1 is applied to the gate G of the transistor 1 while a bias voltage (gate bias voltage) Vgg2 is applied to the gate G of the transistor 2. A voltage drop by the resistance element 51 is set close (equal) to, for example, a difference between the gate bias voltage Vgg1 of the transistor 1 and the gate bias voltage Vgg2 of the transistor 2 (|Vgg1−Vgg2|).

The transistor 1 has a drain D that is connected to an output terminal (RFout) via a matching circuit 42 and a λ/4 transmission line 32 and the transistor 2 has a drain D that is connected to the output terminal via a matching circuit 44. Moreover, a power supply voltage Vdd is applied to the drains D of the transistors 1 and 2 and the source S of the transistor 2 is directly connected to the ground GND. The power amplifier according to the first example illustrated in FIG. 4 may not be provided with, for example, the capacitative element 52. However, it is preferable to provide the capacitative element 52 to make a high-frequency connection from the source of the transistor 1 to the ground GND.

As in the power amplifier of the first example illustrated in FIG. 4, for example, the resistance element 51 and the capacitative element 52 are provided in parallel between the source S of the transistor 1 and the ground GND. Thus, a gate-to-source voltage Vgs1 can be expressed by the following [Equation 1]:

$$Vgs1 = Vgg1 - Rs \times Idc1 \quad [\text{Equation 1}]$$

where Rs is the resistance value of the resistance element 51 in the control circuit 5 and Idc1 is a current passing through the resistance element 51 (a current passing through the transistor 1).

As described above, in the power amplifier of the first example, the resistance element 51 is inserted between the source S of the transistor (main amplifier) 1 and the ground GND, causing a voltage drop as large as a difference in the gate bias voltage between the transistors 1 and 2 (|Vgg1−Vgg2|). This can reduce a loss of power combination of the outputs of the main amplifier and the auxiliary amplifier with a simple configuration.

Figure 5:
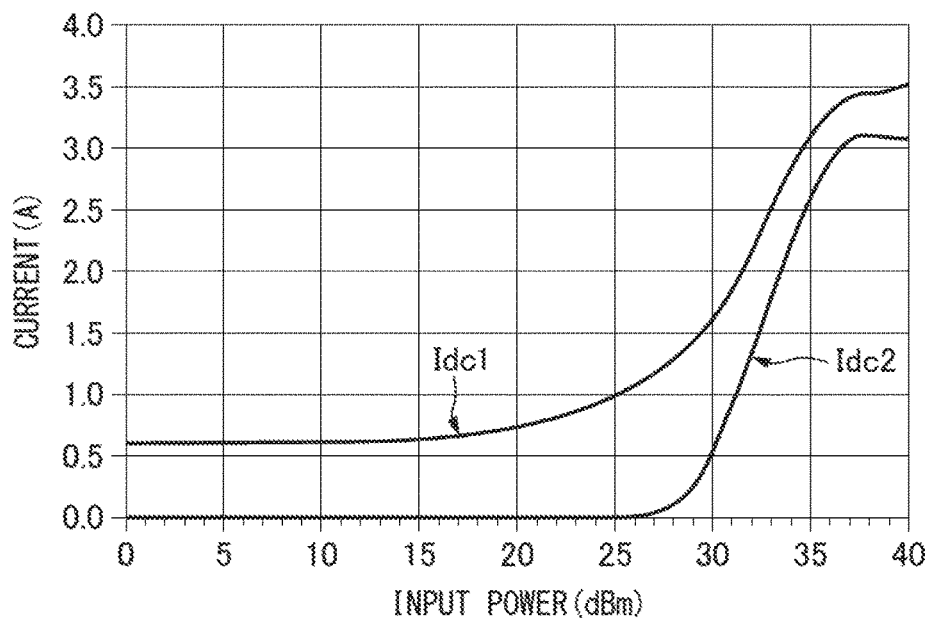
FIG. 5 indicates the relationship between a current passing through a main amplifier and an auxiliary amplifier and input power in the power amplifier of the first example illustrated in FIG. 4.
Figure 6:
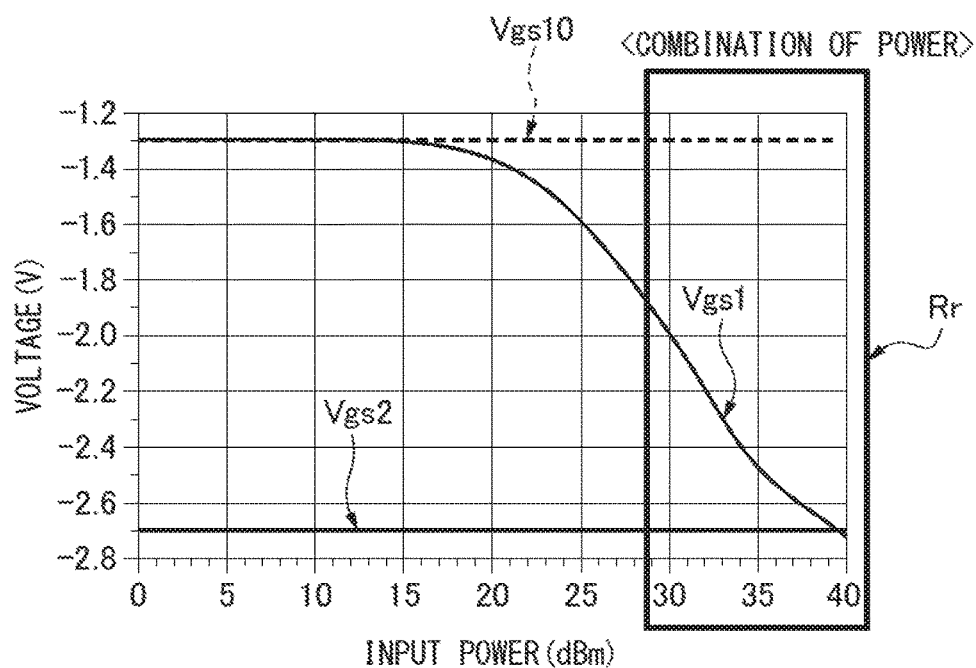
FIG. 6 indicates the relationship between the gate-to-source voltages of the main amplifier and the auxiliary amplifier and input power in the power amplifier of the first example illustrated in FIG. 4.

FIG. 5 indicates the relationship between a current (A) passing through the main amplifier and the auxiliary amplifier and input power (dBm) in the power amplifier of the first example illustrated in FIG. 4. FIG. 6 indicates the relationship between the gate-to-source voltages (V) of the main amplifier and the auxiliary amplifier and the input power (dBm) in the power amplifier of the first example illustrated in FIG. 4.

As indicated by FIG. 5, regarding the current (drain current) Idc1 passing through the transistor (main amplifier) 1, a current drawn from a power supply near the drain of the transistor 1 increases with the input power RFin (output power RFout). Thus, as indicated by FIG. 6, the gate-to-source voltage Vgs1 of the transistor 1 changes to a negative voltage as the input power RFin increases.

Hence, in FIG. 6, a difference in gate-to-source voltage between the transistors 1 and 2 (|Vgs1−Vgs2|) decreases in a rectangular region Rr where the auxiliary amplifier (transistor) 2 also operates to combine power. This can reduce combined power.

In FIG. 6, a broken line Vgs10 indicates the gate-to-source voltage of the transistor 1 in the absence of the control circuit 5 between the source of the transistor 1 and the ground (GND) as illustrated in FIG. 1. In other words, according to the present example, the control circuit 5 (resistance element 51) is provided between the source of the transistor 1 and the ground so as to reduce a difference between the gate-to-source voltages Vgs1 and Vgs2 of the transistors 1 and 2 in the rectangular region Rr. This can suppress power combination.

The capacitative element 52 of the control circuit 5 makes a high-frequency connection from the source of the transistor 1 to the ground (GND) so as to suppress a reduction in gain. In other words, when only the resistance element 51 is inserted between the source of the transistor 1 and the ground, the gain of the transistor (main amplifier) 1 is reduced. The capacitative element 52 is preferably provided, though a loss of power combination can be reduced in the absence of the capacitative element 52 between the source of the transistor 1 and the ground.

Figure 7:
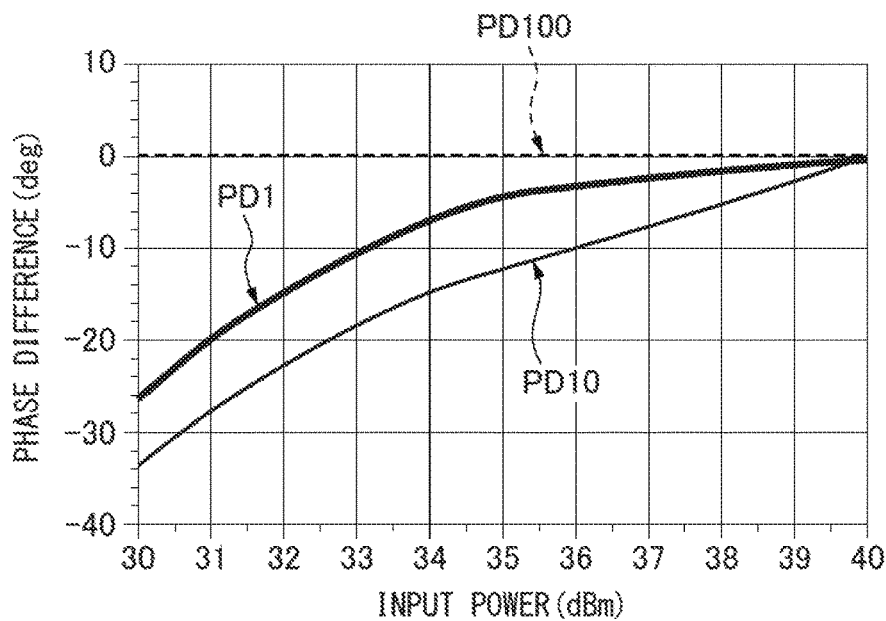
FIG. 7 indicates, in comparison with the power amplifier illustrated in FIG. 1, the relationship between input power and a phase difference between the main amplifier and the auxiliary amplifier in the power amplifier of the first example illustrated in FIG. 4.

FIG. 7 indicates, in comparison with the power amplifier illustrated in FIG. 1, the relationship between the input power (dBm) and a phase difference (deg) between the main amplifier and the auxiliary amplifier in the power amplifier of the first example illustrated in FIG. 4. In FIG. 7, reference symbol PD1 indicates the relationship between a phase difference and input power in the power amplifier of the first example (the characteristic curve of the power amplifier of the first example) and reference symbol PD10 indicates the relationship between input power and a phase difference in the power amplifier illustrated in FIG. 1 (the characteristic curve of the power amplifier illustrated in FIG. 1). Reference symbol PD100 (broken line) indicates an ideal relationship (ideal characteristic curve) between the main amplifier and the auxiliary amplifier without a phase difference.

As is evident from FIG. 7, regardless of the input power RFin, the characteristic curve PD1 of the power amplifier of the first example is closer to the ideal characteristic curve PD100 than the characteristic curve PD10 of the power amplifier illustrated in FIG. 1.

Figure 8:
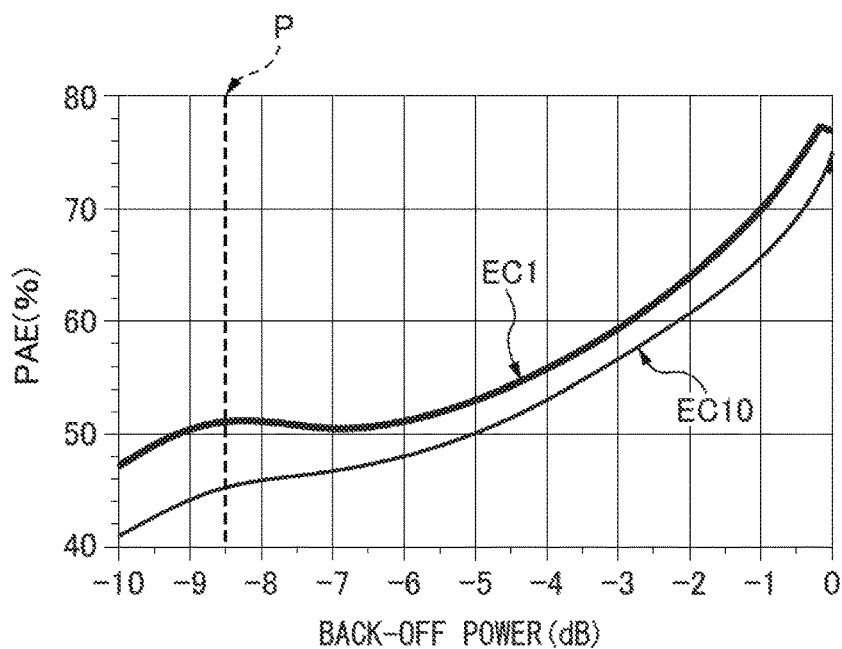
FIG. 8 indicates, in comparison with the power amplifier illustrated in FIG. 1, the relationship between a back-off amount and power-added efficiency in the power amplifier of the first example illustrated in FIG. 4.

FIG. 8 indicates, in comparison with the power amplifier illustrated in FIG. 1, the relationship between a back-off amount (dB) and power-added efficiency (PAE, %) obtained by the power amplifier of the first example illustrated in FIG. 4. In FIG. 8, reference symbol EC1 indicates the relationship between PAE and a back-off amount in the power amplifier of the first example (the characteristic curve of the power amplifier of the first example), and reference symbol EC10 indicates the relationship between PAE and a back-off amount in the power amplifier of FIG. 1 (the characteristic curve of the power amplifier illustrated in FIG. 1).

In FIG. 8, for example, when the power amplifier represented by reference character P outputs power of 40 W, the characteristic curve EC1 of the power amplifier of the first example can increase efficiency by about 6% from that of the characteristic curve EC10 of the power amplifier illustrated in FIG. 1. In other words, as indicated by the broken line of reference character P, for example, operating power with a back-off amount of −8.5 dB can improve PAE (power-added efficiency) from 44% on the characteristic curve EC10 to 50% on the characteristic curve EC1, leading to an increase of about 6%. This is equivalent to, for example, a reduction in power consumption by about 11 W at an output of 40 W. Thus, the power amplifier of the first example can reduce a loss of power combination of the outputs of the main amplifier and the auxiliary amplifier with a simple configuration. This effect can be obtained also in the second and third examples, which will be discussed later.

Figure 9:
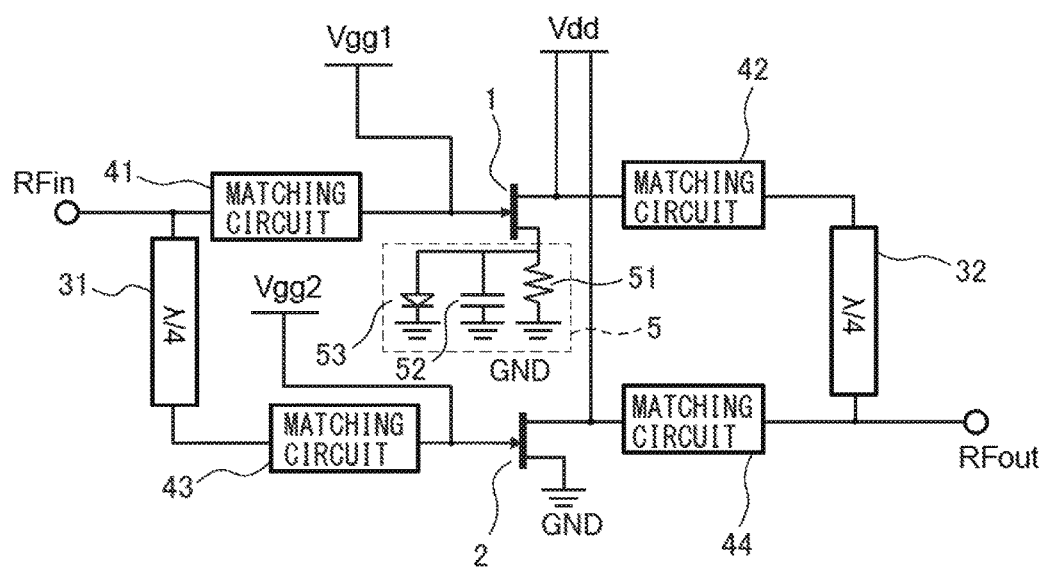
FIG. 9 is a block diagram illustrating a second example of the power amplifier.

FIG. 9 is a block diagram illustrating a second example of the power amplifier. As is evident from a comparison between FIG. 9 and FIG. 4, in the power amplifier of the second example, the control circuit 5 further includes a diode element 53 between the source of the transistor 1 and the ground. In other words, the power amplifier of the second example includes the resistance element 51, the capacitative element 52, and the diode element 53 that are provided in parallel between the source of the transistor (main amplifier) 1 and the ground.

Thus, when a voltage drop caused by the resistance element 51 (the source potential of the transistor 1) reaches at least Vf of the diode element 53, a current begins to pass through the diode element 53, thereby keeping a constant source potential of the transistor 1.

Figure 10:
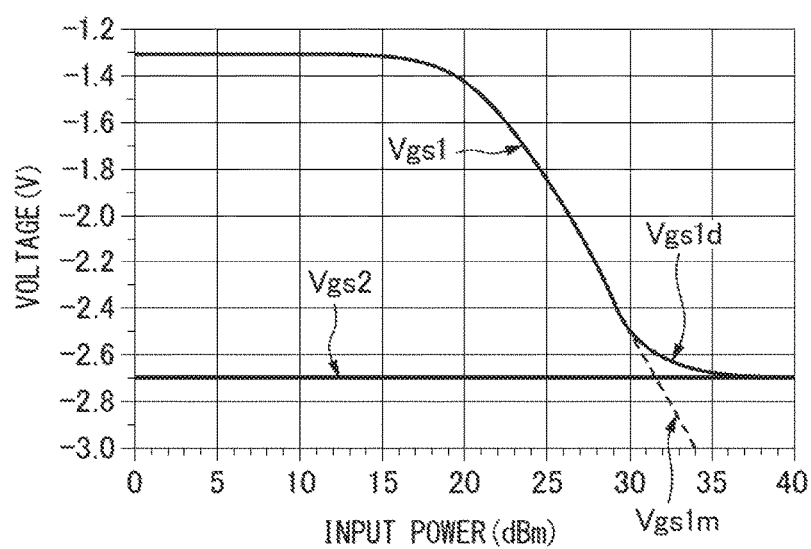
FIG. 10 indicates the relationship between input power and the gate-to-source voltages of the main amplifier and the auxiliary amplifier in a power amplifier of a second example illustrated in FIG. 9.

FIG. 10 indicates the relationship between input power and the gate-to-source voltages of the main amplifier and the auxiliary amplifier in the power amplifier of the second example illustrated in FIG. 9. FIG. 10 corresponds to FIG. 6. In FIG. 10, reference symbol Vgs1 represents the gate-to-source voltage of the transistor 1, reference symbol Vgs1n represents a gate-to-source voltage in the absence of the diode element 53, and reference symbol Vgs1d represents a gate-to-source voltage in the presence of the diode element 53. Reference symbol Vgs2 represents the gate-to-source voltage of the transistor 2.

As indicated in FIG. 10, a comparison between Vgs1n and Vgs1d proves that Vgs1d in the presence of the diode element 53 can be closer to Vgs2 of the transistor 2 than Vgs1d in the absence of the diode element 53. Thus, the power amplifier of the second example can reduce a difference between the gate-to-source voltage Vgs1(Vgs1d) of the main amplifier 1 and the gate-to-source voltage Vgs2 of the auxiliary amplifier 2 and a phase difference between the main amplifier 1 and the auxiliary amplifier 2 in a wider range, thereby improving efficiency. In other words, the power amplifier of the second example can further reduce a loss of power combination of the outputs of the main amplifier and the auxiliary amplifier with a simple configuration.

Figure 11:
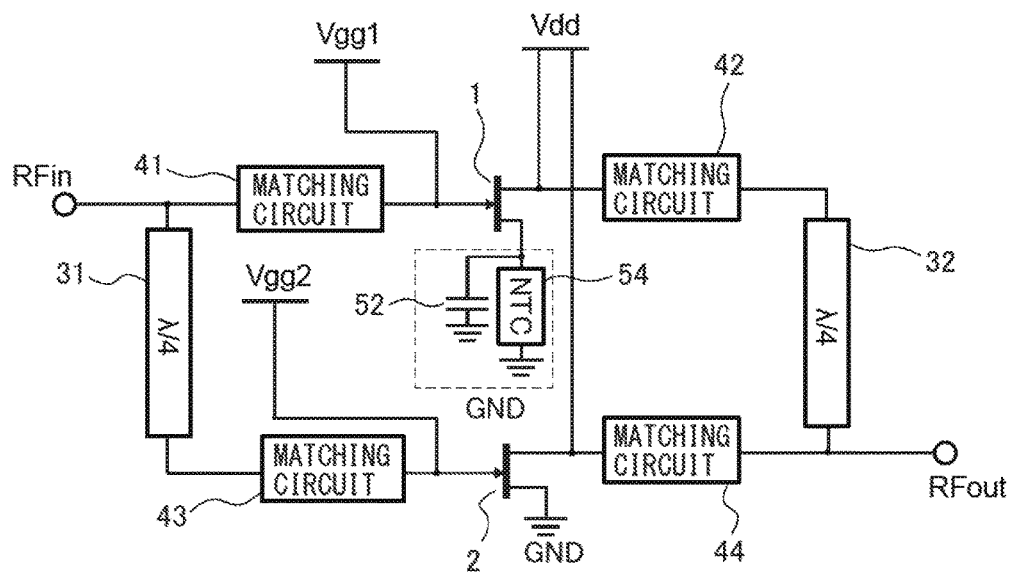
FIG. 11 is a block diagram illustrating a third example of the power amplifier.

FIG. 11 is a block diagram illustrating a third example of the power amplifier. As is evident from a comparison between FIG. 11 and FIG. 4, the resistance element 51 in the control circuit 5 is replaced with an NTC thermistor element 54 in the power amplifier of the third example. In other words, the NTC thermistor element 54 and the capacitative element 52 are provided in parallel between the source of the transistor 1 and the ground.

A thermistor is an element that changes in resistance value according to temperature. The NTC (Negative Temperature Coefficient) thermistor element 54 is, in particular, characterized by a resistance value that decreases with temperature. The NTC thermistor element 54 inserted in place of the resistance element 51 of the first example increases the current Idc1 passing through the transistor (main amplifier) 1 at high output power, causing a temperature increase. Moreover, the resistance value of the NTC thermistor element 54 decreases so as to reduce a voltage drop.

This reduces fluctuations in the gate-to-source voltage Vgs1 at high output power and reduces a difference in gate-to-source voltage and a phase difference between the main amplifier and the auxiliary amplifier in a wider range, thereby improving efficiency. In other words, the power amplifier of the third embodiment can further reduce a loss of power combination of the outputs of the main amplifier and the auxiliary amplifier with a simple configuration.

Figure 12A:
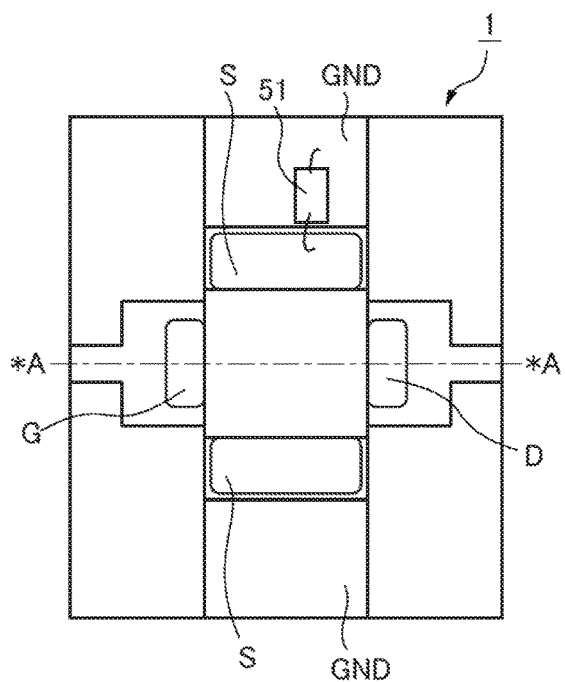
FIG. 12A and FIG. 12B are explanatory drawings illustrating an example of the main amplifier in the power amplifier of the first example illustrated in FIG. 4.
Figure 12B:
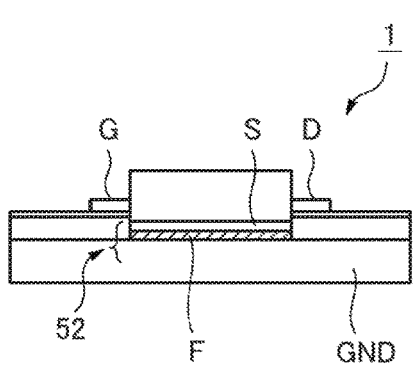
Figure 13:
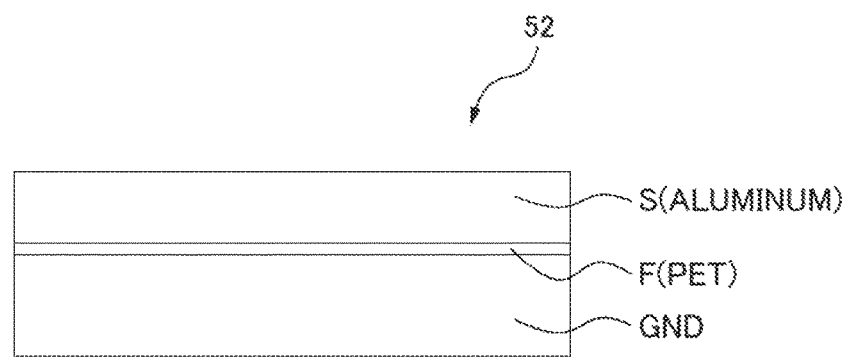
FIG. 13 illustrates an example of a capacitative element in the main amplifier of FIG. 12A and FIG. 12B.

FIG. 12A and FIG. 12B are explanatory drawings illustrating an example of the main amplifier in the power amplifier of the present embodiment. FIG. 12A is a plan view of the main amplifier and FIG. 12B is a side view taken along line *A-*A of FIG. 12A. As illustrated in FIG. 12A and FIG. 12B, the main amplifier (transistor) 1 has the gate G, the source S, and the drain D and includes the resistance element 51 provided between the source S of the transistor 1 and the ground GND. Referring to FIG. 13, the capacitative element 52 including the ground GND, aluminum (the source S of the transistor 1), and a film F is provided between the source S of the transistor 1 and the ground GND.

FIG. 13 illustrates an example of the capacitative element in the main amplifier of FIG. 12A and FIG. 12B. As illustrated in FIG. 13, the capacitative element 52 in the main amplifier 1 illustrated in FIG. 12A and FIG. 12B includes an insulating film (insulating sheet) F formed on the ground GND made of materials such as a metal. The insulating film F may be, for example, a PET (PolyEthylene Terephthalate) film having a thickness of about 5 μm.

For example, an aluminum film having a thickness of about 100 μm is formed on the insulating film F by sputtering. The aluminum film is used as the source S of the transistor 1. Hence, the capacitative element 52 can be provided between the source S of the transistor 1 and the ground GND. The PET film and aluminum are merely exemplary and thus naturally, various other films and materials are also applicable.

In other words, in the main amplifier (transistor) 1 of the present embodiment, the thin insulating film F inserted between the source S of the main amplifier and the ground GND enables the function of the capacitative element (capacitor) 52. The capacitative element 52 thus configured can suppress a parasitic inductance or parasitic resistance when being mounted, thereby reducing mismatches. The insulating film F is, for example, several hundred nm to several μm in thickness depending on the set capacitance value of the capacitative element 52.

Figure 14:
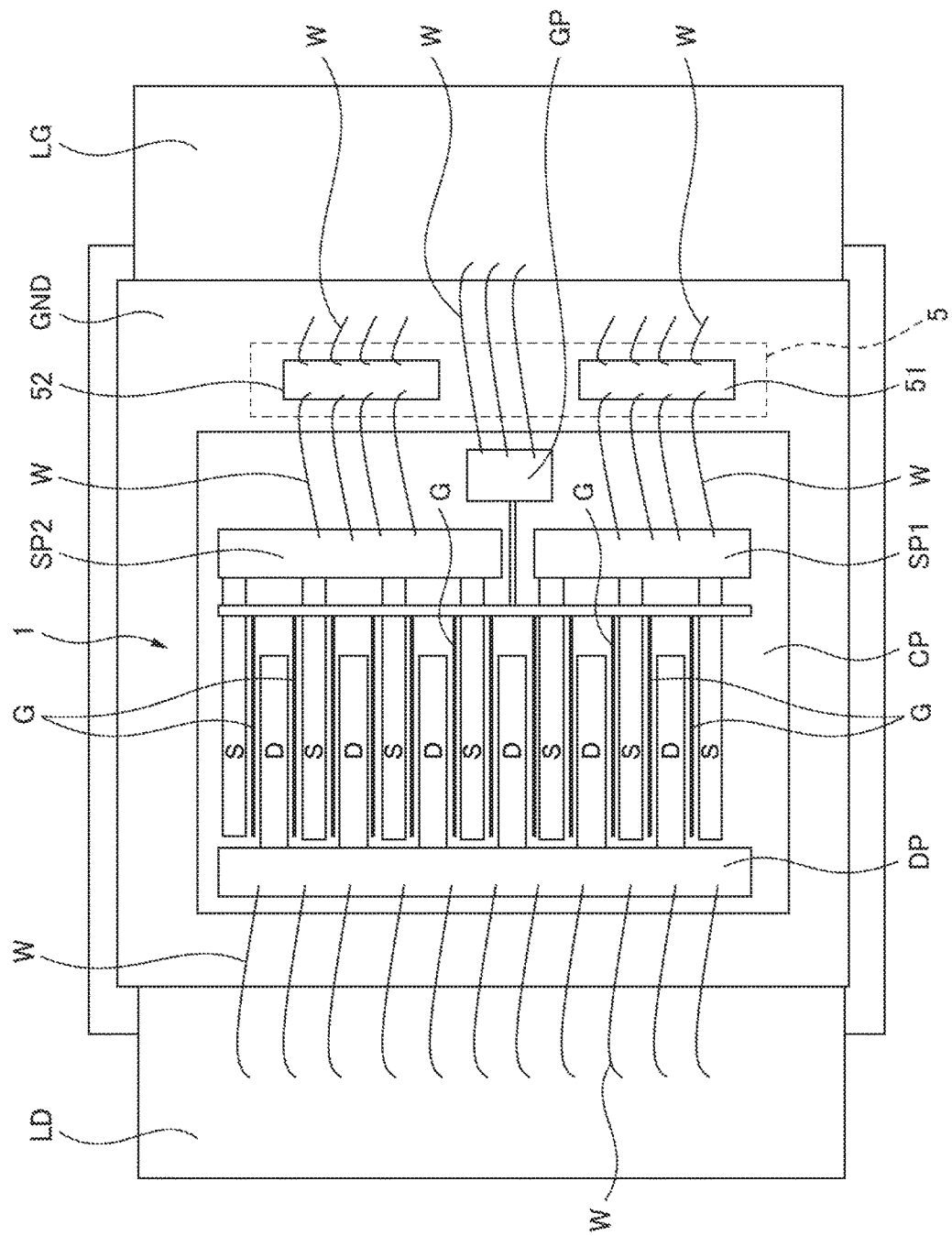
FIG. 14 is a schematic diagram of an example of a semiconductor integrated circuit including the power amplifier of the present embodiment.

FIG. 14 is a schematic diagram of an example of a semiconductor integrated circuit (IC package) including the power amplifier of the present embodiment. In other words, the main amplifier 1 (auxiliary amplifier 2) is a single transistor in the above description but may be formed by multiple transistors. FIG. 14 only illustrates the main amplifier 1 (semiconductor chip CP) formed by multiple transistors, the resistance element 51, and the capacitative element 52. For example, the auxiliary amplifier 2, the λ/4 transmission lines 31 and 32, and the matching circuits 41 to 44 may be also provided.

In FIG. 14, reference symbols G, D, and S represent the gates, drains, and sources of the transistors constituting the main amplifier 1, LG represents a gate lead, LD represents a drain lead, and W represents wires. Reference symbol GP represents a gate electrode pad, DP represents a drain electrode pad, and SP1 and SP2 represent source electrode pads.

As illustrated in FIG. 14, the gate G, the drain D, and the source of each of the transistors formed on the semiconductor chip CP are connected to the gate electrode pad GP, the drain electrode pad DP, and the source electrode pads SP1 and SP2. The resistance element 51 is provided between the source electrode pad SP1 and the ground GND via multiple wires. Moreover, the capacitative element 52 is provided between the source electrode pad SP2 and the ground GND via multiple wires. The gate electrode pad GP is connected to the gate lead LG via multiple wires while the drain electrode pad DP is connected to the drain lead LD via multiple wires.

The power amplifier of the present embodiment (main amplifier 1 and the control circuit 5 including the resistance element 51 and the capacitative element 52) can be provided as a single semiconductor integrated circuit. This configuration can achieve a simple circuit. Furthermore, the lengths of the wires W are adjusted so as to suppress, for example, fluctuations in the parasitic inductances of the resistance element 51 and the capacitative element 52, thereby also facilitating matching.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power amplifier comprising:
a main amplifier configured to amplify input power;
an auxiliary amplifier configured to amplify the input power when the input power exceeds a certain level; and
a control circuit, provided between a source of the main amplifier and a ground, configured to control a source potential of the main amplifier so as to increase the source potential when the input power reaches at least a certain value, wherein the power amplifier is a Doherty-type power amplifier, and
the control circuit includes:
a resistance element provided between the source of the main amplifier and the ground;
a capacitative element provided in parallel with the resistance element between the source of the main amplifier and the ground; and
a diode element provided in parallel with the resistance element and the capacitative element between the source of the main amplifier and the ground.

2. A power amplifier comprising:
a main amplifier configured to amplify input power;
an auxiliary amplifier configured to amplify the input power when the input power exceeds a certain level; and
a control circuit, provided between a source of the main amplifier and a ground, configured to control a source potential of the main amplifier so as to increase the source potential when the input power reaches at least a certain value, wherein the power amplifier is a Doherty-type power amplifier, and
the control circuit includes an NTC thermistor element and a capacitative element that are provided in parallel between the source of the main amplifier and the ground.

3. A power amplifier comprising:
a main amplifier configured to amplify input power;
an auxiliary amplifier configured to amplify the input power when the input power exceeds a certain level; and
a control circuit, provided between a source of the main amplifier and a ground, configured to control a source potential of the main amplifier so as to increase the source potential when the input power reaches at least a certain value, wherein the power amplifier is a Doherty-type power amplifier, and
the control circuit includes:
a resistance element provided between the source of the main amplifier and the ground; and
a capacitative element provided in parallel with the resistance element between the source of the main amplifier and the ground, wherein
the capacitative element is formed by the source of the main amplifier, the ground, and an insulating film provided between the source of the main amplifier and the ground.

4. The power amplifier according to claim 1, wherein a voltage drop caused by the control circuit between the source of the main amplifier and the ground is equal to a difference in gate bias voltage between the main amplifier and the auxiliary amplifier.

5. The power amplifier according to claim 1, wherein the main amplifier includes a first transistor operating as a class A or AB transistor, and
the auxiliary amplifier includes a second transistor operating as a class B or C transistor.

* * * * *